United States Patent
Hasegawa

(10) Patent No.: US 9,635,753 B2
(45) Date of Patent: Apr. 25, 2017

(54) WIRING BOARD

(71) Applicant: KYOCERA Circuit Solutions, Inc., Kyoto (JP)

(72) Inventor: Yoshihiro Hasegawa, Yasu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 14/723,604

(22) Filed: May 28, 2015

(65) Prior Publication Data

US 2015/0351227 A1   Dec. 3, 2015

(30) Foreign Application Priority Data

May 30, 2014   (JP) ................. 2014-111972

(51) Int. Cl.
H05K 1/02 (2006.01)
H05K 1/11 (2006.01)

(52) U.S. Cl.
CPC ........... *H05K 1/024* (2013.01); *H05K 1/0216* (2013.01); *H05K 1/0245* (2013.01); *H05K 1/0218* (2013.01); *H05K 1/0237* (2013.01); *H05K 1/0242* (2013.01); *H05K 1/115* (2013.01); *H05K 2201/0195* (2013.01)

(58) Field of Classification Search
CPC ................. H05K 1/024; H05K 1/0242; H05K 2201/0195; H05K 1/0237; H05K 1/115; H05K 1/03; H05K 1/05; H05K 1/053; H05K 1/056; H05K 2201/0738; H05K 1/0213; H05K 1/0216; H05K 1/0218; H05K 1/0219; H05K 1/0224; H05K 1/0227; H05K 1/0228; H05K 1/0236; H05K 1/0239; H05K 1/0245; H05K 1/0246; H05K 1/0248; H05K 1/025; H05K 1/0253; H05K 1/0256; H05K 1/0257; H05K 1/0259; H05K 1/026; H05K 1/0263; H05K 1/0265; H05K 1/0278; H05K 1/0284; H05K 1/0296; H05K 1/0298; H05K 1/036; H05K 1/0366; H05K 1/0373; H05K 1/0393; H05K 1/11; H05K 1/111

See application file for complete search history.

(56) References Cited

U.S. PATENT DOCUMENTS

| 4,864,722 A * | 9/1989 | Lazzarini ............... H05K 1/024 174/256 |
| 7,663,064 B2 * | 2/2010 | Dutta ..................... H05K 1/024 174/255 |
| 8,084,863 B2 * | 12/2011 | Japp ...................... H01L 23/145 257/758 |

FOREIGN PATENT DOCUMENTS

JP   2007-201221 A   8/2007

* cited by examiner

*Primary Examiner* — Ishwarbhai B Patel
(74) *Attorney, Agent, or Firm* — Volpe and Koenig, P.C.

(57) ABSTRACT

A wiring board in the present invention includes an insulating layer, a via-hole penetrating from an upper surface to a lower surface of the insulating layer, a wiring formation layer, and a grounding or power supply conductor, in which the wiring formation layer is formed of a plurality of strip-shaped conductors, and an insulating resin portion filled in at least between the strip-shaped conductors, the grounding or power supply conductor is formed to partially face the strip-shaped conductors, and a relative permittivity of the insulating layer is higher than a relative permittivity of the insulating resin portion.

4 Claims, 2 Drawing Sheets

WIRING BOARD

BACKGROUND OF THE INVENTION

1. Technical Field

The present invention relates to a wiring board on which a semiconductor element is mounted.

2. Background

Recently, electronic devices including a portable game machine and a communication device are further reduced in size and increased in speed, so that a wiring board used in those devices is required to transmit a signal to densely-formed wiring at high speed. In order to realize the high-speed transmission, there is a system called a differential transmission system using a high-frequency signal.

As disclosed in Unexamined Japanese Patent Publication No. 2007-201221, in the differential transmission system, a signal is transmitted through differential lines formed of two parallel strip-shaped conductors. A voltage signal having a different polarity is transmitted from a transmission unit to each of the strip-shaped conductors, and a difference between the signals is taken and read in a reception unit, so that the signal can be easily read without the need to increase an amplitude of the signal to be transmitted to each of the strip-shaped conductors. Therefore, a time for forming the amplitude of the signal can be reduced, so that the signal can be transmitted at high speed.

FIG. 4 is a schematic cross-sectional view of a conventional wiring board B using the differential transmission system. The wiring board B includes a core insulating plate 11, an insulating layer 12, a wiring conductor 13, and a solder resist layer 14. A mounting portion 11a on which a semiconductor element is mounted is formed in a center of an upper surface of the wiring board B. The insulating plate 11 has a plurality of through-holes 15 penetrating from its upper surface to lower surface. The two insulating layers 12 are laminated on each surface of the insulating plate 11, and a plurality of via-holes 16 are formed in the insulating layer 12. The wiring conductors 13 are deposited on the surface of the insulating plate 11 and in the through holes 15, and on the surface of the insulating layer 12 and in the via-holes 16. The wiring conductor 13 includes differential lines 13a formed of two parallel strip-shaped conductors. Grounding or power supply conductors 13b are formed on the surfaces of the insulating plate 11 and the insulating layer 12 so as to partially face the differential lines 13a.

In addition, the wiring conductor 13 formed on the outer layer side insulating layer 12 provided above the insulating plate 11 partially functions as a semiconductor element connection pad 17 which is to be connected to a semiconductor element. The wiring conductor 13 formed on the outer layer side insulating layer 12 provided below the insulating plate 11 partially functions as an external connection pad 18 which is to be connected to an external circuit board. The solder resist layer 14 is formed on the surface of the outer layer side insulating layer 12. The upper solder resist layer 14 has an opening 14a to expose the semiconductor element connection pad 17, and the lower solder resist layer 14 has an opening 14b to expose the external connection pad 18. When an electrode of the semiconductor element is connected to the semiconductor element connection pad 17, and the external connection pad 18 is connected to a wiring conductor of the external electric circuit board, the semiconductor element is electrically connected to the external electric circuit board. Consequently, the semiconductor element is operated in such a manner that a signal is transmitted between the semiconductor element and the external electric circuit board through the wiring conductors 13 and the differential lines 13a.

When the signal flows through the strip-shaped conductor, an electromagnetic wave propagates from the transmission unit to the reception unit of the signal. This electromagnetic wave is generated not only inside the strip-shaped conductor but also in its periphery. Therefore, when the strip-shaped conductors extending in parallel come closer to each other along with the high-density wiring, the electromagnetic wave generated in the periphery of one strip-shaped conductor at the time of signal transmission could interfere with the other closely formed strip-shaped conductor, and a noise could be generated. Especially, due to higher frequency, the noise generation becomes more conspicuous. Therefore, the problem is that the semiconductor element is erroneously operated because the noise is generated in the signal being transmitted.

SUMMARY

An object of the present invention is to provide a high-density wiring board capable of transmitting a noiseless signal in a wiring board in which a high-frequency signal is transmitted at high speed, so that a semiconductor element can be operated in a stable manner.

A wiring board according to an embodiment of the present invention includes an insulating layer; a via-hole penetrating from an upper surface to a lower surface of the insulating layer to electrically connect the upper surface to the lower surface of the insulating layer; a wiring formation layer formed on a surface of the insulating layer; and a grounding or power supply conductor formed on a surface opposite to the surface of the insulating layer on which the wiring formation layer is formed, in which the wiring formation layer is formed of a plurality of strip-shaped conductors extending in parallel to each other, and an insulating resin portion filled in at least between the strip-shaped conductors, the grounding or power supply conductor is formed to partially face the strip-shaped conductors, and a relative permittivity of the insulating layer is higher than a relative permittivity of the insulating resin portion.

According to the wiring board in the embodiment of the present invention, the relative permittivity of the insulating layers disposed above and below the strip-shaped conductors is higher than the relative permittivity of the insulating resin portion filled between the strip-shaped conductors. Thus, when the components each having the different relative permittivity are closely disposed, the electromagnetic wave is likely to be intensively generated in a direction of the component having the higher relative permittivity, so that the electromagnetic wave generated around each of the strip-shaped conductors at the time of signal transmission can be more intensively distributed in a direction of the insulating layers provided above and below the strip-shaped conductors than in a direction of the insulating resin portion provided between the strip-shaped conductors. As a result, the electromagnetic wave generated around the one strip-shaped conductors can be prevented from interfering with the other strip-shaped conductor closely provided across the insulating resin portion, so that a noise is not generated. Thus, it is possible to provide the wiring board capable of transmitting a noiseless favorable signal, so that the semiconductor element can be operated in a stable manner.

DETAILED DESCRIPTION

Figure 1:
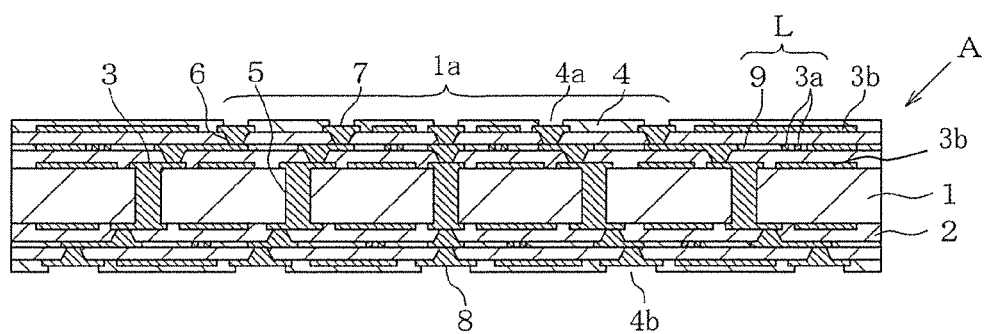
FIG. 1 is a schematic cross-sectional view illustrating a wiring board according to one embodiment of the present invention.

Next, a wiring board according to one embodiment will be described with reference to FIG. 1. A wiring board A according to the one embodiment includes a core insulating plate 1 (core board), an insulating layer 2, a wiring conductor 3, and a solder resist layer 4. Furthermore, the wiring board A has a mounting portion 1a in a center of its upper surface, on which a semiconductor element is mounted.

The insulating plate 1 has a plurality of through-holes 5 penetrating from its upper surface to lower surface. Furthermore, the wiring conductors 3 are deposited on the upper and lower surfaces of the insulating plate 1 and in the through-holes 5, so that the wiring conductors 3 provided on the upper and lower surfaces of the insulating plate 1 are electrically connected. The insulating plate 1 is formed of an insulating material provided by impregnating glass cloth with an epoxy resin or bismaleimide triazine resin and thermally curing it. The through-holes 5 are formed by drilling, laser processing, or blasting, for example.

The insulating layers 2 are provided on each of the upper and lower surfaces of the insulating plate 1 as an inner layer side and an outer layer side insulating layers 2. The insulating layer 2 has a plurality of via-holes 6. Furthermore, the wiring conductors 3 are deposited on surfaces of the outer layer side insulating layer 2 and in the via-holes 6, so that the wiring conductors 3 provided above and below the insulating layer 2 are electrically connected. The insulating layer 2 is formed of an insulating material provided by thermally curing a resin such as bismaleimide triazine resin or polyimide resin. A relative permittivity of the insulating layer 2 is about 4.5 or more.

The via-holes 6 are formed by laser processing, for example. As described above, the wiring conductors 3 are deposited on the upper and lower surfaces of the insulating plate 1 and in the through-holes 5, and on the surfaces of the insulating layer 2 and in the via-holes 6. Furthermore, the wiring conductor 3 deposited on the outer layer side insulating layer 2 provided above the insulating plate 1 partially functions as a semiconductor element connection pad 7 which is to be connected to the semiconductor element. The wiring conductor 3 deposited on the outer layer side insulating layer 2 provided below the insulating plate 1 partially functions as an external connection pad 8 which is to be connected to an external circuit board.

The wiring conductor 3 deposited on the insulating plate 1 or the insulating layer 2 is formed of a metal having favorable electric conductivity such as plated copper or copper foil, and formed by the known pattern forming method.

The solder resist layer 4 is formed of a thermosetting resin such as polyimide resin, and formed on the surface of the outer layer side insulating layer 2. The solder resist layer 4 provided above the insulating plate 1 has an opening 4a to expose the semiconductor element connection pad 7, and the solder resist layer 4 provided below the insulating plate 1 has an opening 4b to expose the external connection pad 8. When an electrode of the semiconductor element is connected to the semiconductor element connection pad 7, and the external connection pad 8 is connected to a wiring conductor of the external electric circuit board, the semiconductor element is electrically connected to the external electric circuit board. Consequently, the semiconductor element is operated in such a manner that a signal is transmitted between the semiconductor element and the external electric circuit board through the wiring conductors 3.

In addition, in the wiring board A according to the one embodiment, the wiring conductors 3 includes a plurality of differential lines 3a formed of parallel couples of strip-shaped conductors. Grounding or power supply conductors 3b are formed on the surface of the insulating plate 1 and on the upper surface of the outer layer side insulating layer 2 so as to partially face the differential lines 3a. A width of the strip-shaped conductor of the differential line 3a is approximately 5 µm to 15 µm, and a distance between the strip-shaped conductors is approximately 1 µm to 3 µm.

Figure 2:
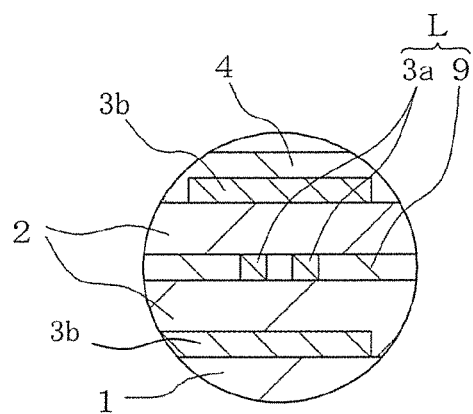
FIG. 2 is an essential part enlarged view illustrating the wiring board according to the one embodiment of the present invention.

Furthermore, in the wiring board A according to the one embodiment, an insulating resin portion 9 is deposited on the surface of the insulating layer 2 on which the differential lines 3a are formed. As illustrated in FIG. 2, the insulating resin portion 9 is deposited so as to fill a space between the wiring conductors 3 formed on the surface of the insulating layer 2 on which the differential lines 3a are formed, and a space between the strip-shaped conductors of the differential lines 3a with a thickness which is substantially the same as that of the wiring conductor 3. In this specification, the wiring conductor 3 and the insulating resin portion 9 provided on the surface of the insulating layer 2 on which the differential lines 3a are formed are referred to as a "wiring formation layer L". The insulating resin portion 9 in the wiring formation layer L is formed of an electric insulating material such as epoxy resin, and has a relative permittivity lower than the relative permittivity of the insulating layer 2. For example, a difference between the relative permittivity of the insulating layer 2 and the relative permittivity of the insulating resin portion 9 is preferably 0.5 or more. More specifically, when the relative permittivity of the insulating layer 2 is 4.5 or more, the relative permittivity of the insulating resin portion 9 is approximately 2 to 4.

As described above, according to the wiring board A in the one embodiment, the insulating resin portion 9 having the relative permittivity of approximately 2 to 4 is filled in the space between the strip-shaped conductors of the differential lines 3a, and is filled in the space between the wiring conductors 3, and furthermore, the strip-shaped conductors of the differential lines 3a and grounding or power supply conductors 3b are disposed above and below via the insulating layers 2 having the relative permittivity of 4.5 or more. Thus, an electromagnetic wave generated around each of the strip-shaped conductors at the time of the signal transmission can be distributed more intensively in directions of the insulating layers 2 provided above and below the strip-shaped conductors, than in a direction of the insulating resin portion 9 provided between the strip-shaped conductors. This is because when components each having a different relative permittivity are closely disposed, the electromagnetic wave is likely to be intensively generated in a direction of the component having the higher relative permittivity. As a result, the electromagnetic wave generated around each of the strip-shaped conductors can be prevented from interfering with the other strip-shaped conductor closely provided across the insulating resin portion 9, so that a noise is not generated. Consequently, it is possible to provide the wiring board capable of transmitting a noiseless favorable signal, so that the semiconductor element can be operated in a stable manner.

The wiring formation layer L is formed in the following manner, for example. The insulating resin portion 9 is laminated on the surface of the insulating layer 2. Subsequently, the insulating resin portion 9 is grooved to form the pattern of the wiring conductors 3, and the via-holes 6 are formed so as to penetrate insulating resin portion 9 and the insulating layer 2. The grooving process and the process for forming the via-holes 6 are performed by laser processing. Subsequently, a plated conductor layer is deposited on the surface of the insulating resin portion 9 so as to completely fill the grooved portions and the via-holes 6. Finally, grinding is performed until a surface of the plated conductor layer and a surface of insulating resin portion 9 are planarized and have the same height.

Figure 3:
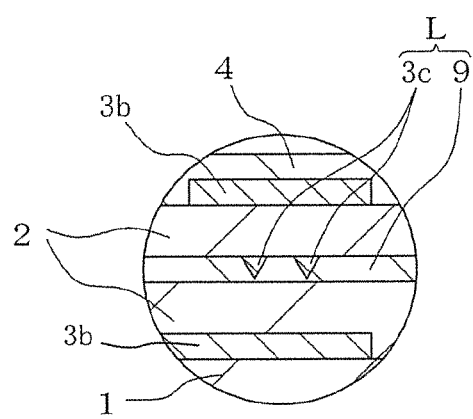
FIG. 3 is an essential part enlarged view illustrating a wiring board according to another embodiment of the present invention.
Figure 4:
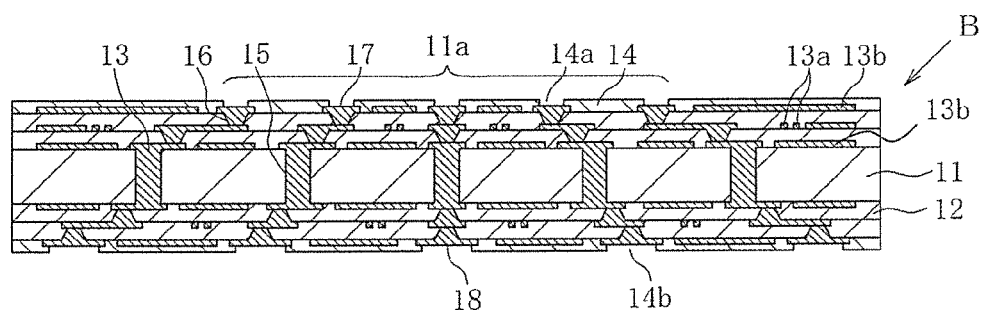
FIG. 4 is a schematic cross-sectional view illustrating a conventional wiring board.

In addition, the present invention is not limited to the above one embodiment, and can be modified variously without departing from the scope of the present invention. For example, according to the one embodiment, the strip-shaped conductor has a quadrangular cross-sectional surface, but it may have a triangular cross-sectional surface as illustrated in FIG. 3. In the case of the triangular shape, a distance between the strip-shaped conductors can be largely provided, so that it is possible to further reduce the interference of the electromagnetic wave at the time of signal transmission.

According to the above one embodiment, the two insulating layers are laminated on each of the upper and lower surfaces of the insulating plate 1, but the number of the layers may not be two, and the number of the layers may be different between the upper and the lower surfaces of the insulating plate 1.

What is claimed is:
1. A wiring board comprising:
an insulating layer having a relative permittivity of 4.5 or more;
a via-hole penetrating from an upper surface to a lower surface of the insulating layer to electrically connect the upper surface to the lower surface of the insulating layer;
a wiring formation layer formed on a surface of the insulating layer; and
a grounding or power supply conductor formed on a surface opposite to the surface of the insulating layer on which the wiring formation layer is formed, wherein
the wiring formation layer is formed of a plurality of strip-shaped conductors extending in parallel to each other, and an insulating resin portions filled in at least between the strip-shaped conductors,
the grounding or power supply conductor is formed to partially face the strip-shaped conductors, and
a ratio of the relative permittivity of the insulating layer and a relative permittivity of the insulating resin portion is at least 1.125.
2. The wiring board according to claim 1, wherein
each of the strip-shaped conductors has a triangular cross-sectional surface taken vertically in an extending direction.
3. The wiring board according to claim 1, wherein
a difference between the relative permittivity of the insulating layer and the relative permittivity of the insulating resin portion is 0.5 or more.
4. The wiring board according to claim 1, wherein
the insulating resin portion has the relative permittivity of 2 to 4.

* * * * *